(12) United States Patent
Fredeman et al.

(10) Patent No.: US 9,053,770 B1
(45) Date of Patent: Jun. 9, 2015

(54) DYNAMIC CASCODE-MANAGED HIGH-VOLTAGE WORD-LINE DRIVER CIRCUIT

(71) Applicant: INTERNATIONAL BUSINESS MACHINES CORPORATION, Armonk, NY (US)

(72) Inventors: Gregory J. Fredeman, Wappingers Falls, NY (US); Abraham Mathews, Austin, TX (US); Donald W. Plass, Poughkeepsie, NY (US); Kenneth J. Reyer, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/300,617

(22) Filed: Jun. 10, 2014

Related U.S. Application Data

(63) Continuation of application No. 14/099,573, filed on Dec. 6, 2013.

(51) Int. Cl.

| | | |
|---|---|---|
| *G11C 7/10* | (2006.01) | |
| *G11C 5/14* | (2006.01) | |
| *G11C 11/4074* | (2006.01) | |
| *G11C 7/12* | (2006.01) | |
| *G11C 7/08* | (2006.01) | |

(52) U.S. Cl.
CPC ............... *G11C 7/12* (2013.01); *G11C 7/1057* (2013.01); *G11C 7/08* (2013.01); *G11C 7/1069* (2013.01); *G11C 5/14* (2013.01); *G11C 7/10* (2013.01)

(58) Field of Classification Search
CPC ............ G11C 5/147; G11C 7/08; G11C 7/10; G11C 7/1069; G11C 5/14

USPC ............ 365/203, 189.05, 230.06, 189.09, 63, 365/189.07

See application file for complete search history.

(56) References Cited

U.S. PATENT DOCUMENTS

| | | |
|---|---|---|
| 6,172,917 B1 | 1/2001 | Kataoka et al. |
| 6,693,469 B2 | 2/2004 | Prodanov |
| 6,707,755 B1 | 3/2004 | Somasekhar et al. |
| 6,906,556 B2 | 6/2005 | Choe |
| 7,283,406 B2 | 10/2007 | Lu et al. |
| 7,345,946 B1 | 3/2008 | Chapman et al. |
| 7,701,263 B2 | 4/2010 | Kumar et al. |
| 8,120,968 B2 | 2/2012 | Reohr et al. |
| 2008/0116938 A1 | 5/2008 | Ngo et al. |
| 2010/0141324 A1 | 6/2010 | Wang et al. |

OTHER PUBLICATIONS

U.S. Appl. No. 14/099,573, filed Dec. 6, 2013, Fredeman, et al.

*Primary Examiner* — Ly D Pham
(74) *Attorney, Agent, or Firm* — Mitch Harris, Atty at Law, LLC; Andrew M. Harris; Steven L. Bennett

(57) ABSTRACT

A method of operation of a high-voltage word-line driver circuit for a memory device prevents any single transistor of the driver from having the full power supply voltage from which the word-line output signal is generated, from being applied across any single transistor of the word-line driver circuit. A pair of cascode devices are connected in series with the pull-down device of the input stage and a pull-up device of the input stage, and biased using reference voltages to control the maximum voltage drop across the pull-down device when the pull-down device is off and the pull-up device is active, and to control the maximum voltage drop across the pull-up device when the pull-down device is active. The output stage also includes cascode devices that protect the output pull-down and pull-up devices, and the reference voltages that bias the input and output cascode pairs may be the same reference voltages.

7 Claims, 4 Drawing Sheets

DYNAMIC CASCODE-MANAGED HIGH-VOLTAGE WORD-LINE DRIVER CIRCUIT

The present application is a Continuation of U.S. patent application Ser. No. 14/099,573, filed on Dec. 6, 2013 and claims priority thereto under 35 U.S.C. §120. The disclosure of the above-referenced parent U.S. patent application is incorporated herein by reference.

BACKGROUND OF THE INVENTION

1. Field of the Invention

The present invention is related to memory devices, and more specifically to a dynamic word-line driver circuit having cascode-managed input and output stages.

2. Description of Related Art

Storage elements within memory devices such as dynamic random-access memories (DRAMS) are typically arranged in arrays of rows and columns. The storage elements, or storage cells, are accessed by activating word-lines that gate the storage cells of a particular row onto column bit-lines, which are evaluated to determine the contents of the storage cells.

While word-lines are used in both read and write operations, the word-lines for write operations, particularly in devices such as embedded DRAMS (eDRAMS) that are generally implemented using a single storage capacitor per cell, i.e., a single-transistor (1T) type storage cell, desirably has a higher voltage swing than a read bit-line or a write bit-line for an static random-access memory (SRAM) or a DRAM using 4T, 6T or even larger storage cells. However, the signals provided to the word-line driver are generally typical logic level and not high voltage. Therefore, level translators are typically provided in word-line drivers of devices such as eDRAMS. Level translators increase the amount of delay of the overall memory array, and therefore, there is a tradeoff in memory circuits between write speed, write confidence, and cell complexity. Further, special devices are generally required to handle the higher voltage produced by the word-line driver, leading to process requirements that could otherwise reduce the cost and simplify the manufacture of a memory circuit design.

Therefore, it would be desirable to provide a method of operating a word-line driver circuit with improved delay characteristics and that does not require level translation stages or special higher-voltage devices to implement.

BRIEF SUMMARY OF THE INVENTION

The invention is embodied in a method of operation of a word-line driver circuit that provides reduced memory write delay and that does not require level translation stages and specialized high-voltage devices to implement memory device. The method is a method of operation of the word-line driver circuit.

The word-line driver circuit has an input for receiving an input signal and an input logic stack connected to an evaluation node. One of the input stack transistors has a gate coupled to a pre-charge signal and a source coupled to the evaluation node for pre-charging the evaluation node in response to the pre-charge signal. A second transistor of the input stack has a gate terminal connected to the input and a third one of the input stack transistors is biased by a reference voltage between the power supply voltage and the power supply return voltage, so that the third transistor forms a cascode follower that prevents a leakage current within the input logic stack from causing a full difference between the power supply voltage and the power supply return voltage from being applied across a given one of the first transistor or the second transistor. The word-line driver circuit also includes an output driver circuit for generating the buffered output signal from a state of the evaluation node. The input driver stack may include two cascode devices biased to protect each of the pull-down and pull-up devices in the input driver stack, and the output driver circuit may be an output driver stack that also includes cascode devices for protecting the transistors in the output driver stack.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to memory devices and other circuits in which high-voltage word-line driver circuits are needed. Instead of the typical level translator design, in the exemplary dynamic word-line driver circuit disclosed herein, cascode devices are included in the input and output stages of the word-line driver circuit that prevent the full power supply voltage used to generate the word-line output from appearing across any single transistor. Separate level translations states are not required, as the input signals that are used to trigger evaluation of the dynamic driver's evaluation node can have lower voltage swing than the power supply voltage of the driver circuit that determines the driver circuit's output voltage swing.

Figure 1:
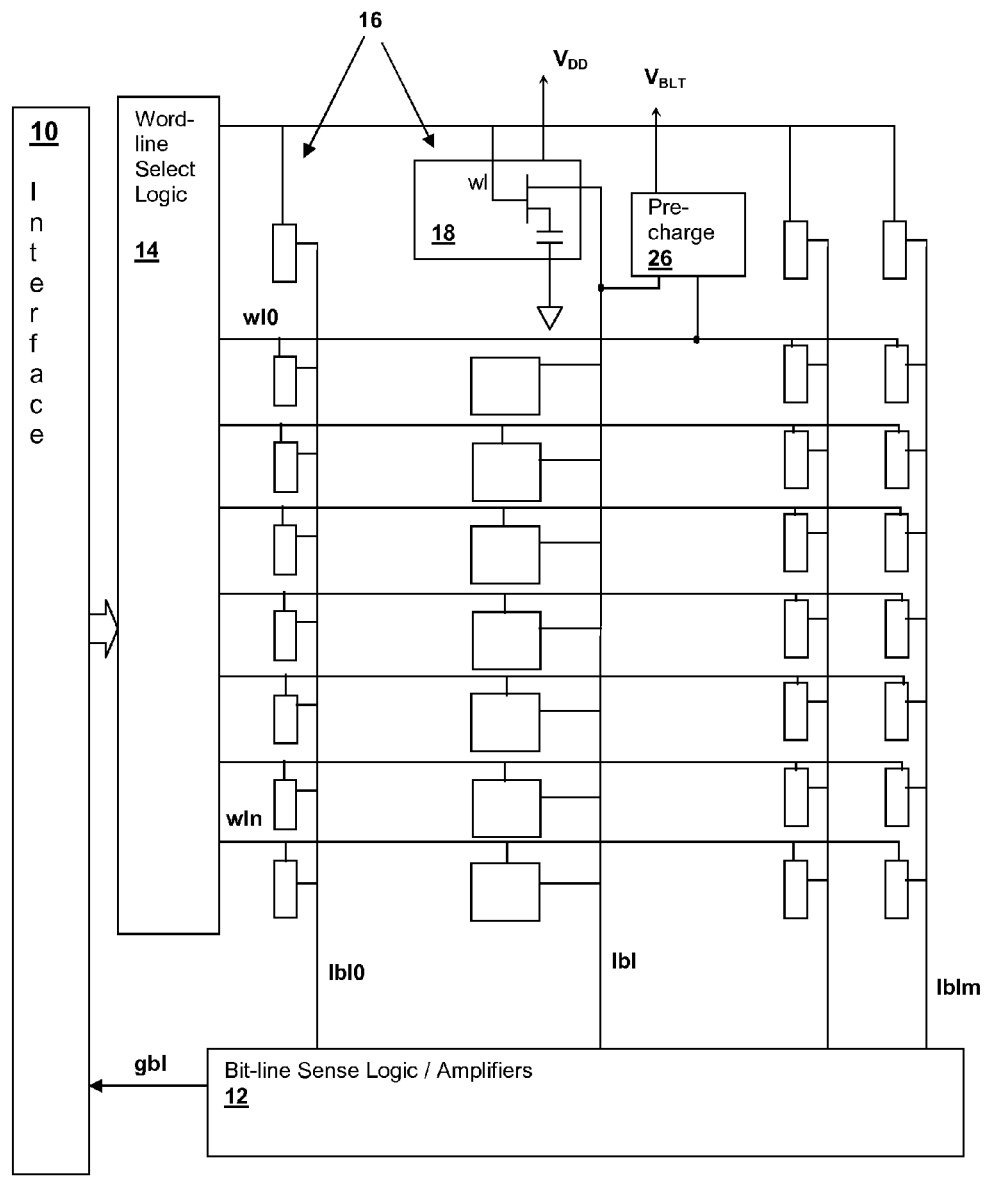
FIG. 1 is a block diagram illustrating an exemplary memory device.

With reference now to the figures, and in particular with reference to FIG. 1, an exemplary memory is shown, which may represent an eDRAM memory internal to a processor integrated circuit, a separate memory device coupled to a processor by a bus, or a memory for integration in another circuit. The memory includes multiple memory cell columns 16 assembled from memory cells 18 coupled to local bit-lines. The local bit-lines have a pre-charge circuit 26 having a logic power supply input $V_{blt}$ that is used to apply the pre-charge voltage to the bit-lines prior to (and optionally during) a read operation. Pre-charge circuit 26 is connected to the bit-lines and provides a pulsed operation that pre-charges the local bit-lines prior to a word-line select logic 14 enabling memory cells 18 of a selected row. During a read operation, if the capacitor in the particular eDRAM memory cell that is enabled for the read operation for a row is discharged (in the example representing a logical "0" value with respect to that memory cell), the corresponding local bit-line lbl is pulled low by the read operation. Otherwise, local bit-line lbl is pulled to a higher voltage. The voltages may vary in different designs, which may include pre-charged non-equalized, equalized designs, or designs in which the memory cell logical-1 state voltage is substantially higher than the bit-line pre-charge voltage. The local bit-lines lbl0-lblm are provided to a bit-line sense logic/sense amplifiers block 12 that selects the appropriate column bit-line and provides the value of the memory cell to external circuits in response to a memory read operation via a global bit-line gbl provided to an interface 10. In general, interface 10 will select from a number of global bit-lines, one for each sub-array within the memory. A row is selected by a particular word-line enable signal wl0-wln asserted from a word-line select logic 14. The present disclosure concerns particular word-line driver designs that may be applied within word-line select logic 14 according to the examples described below.

Figure 2:
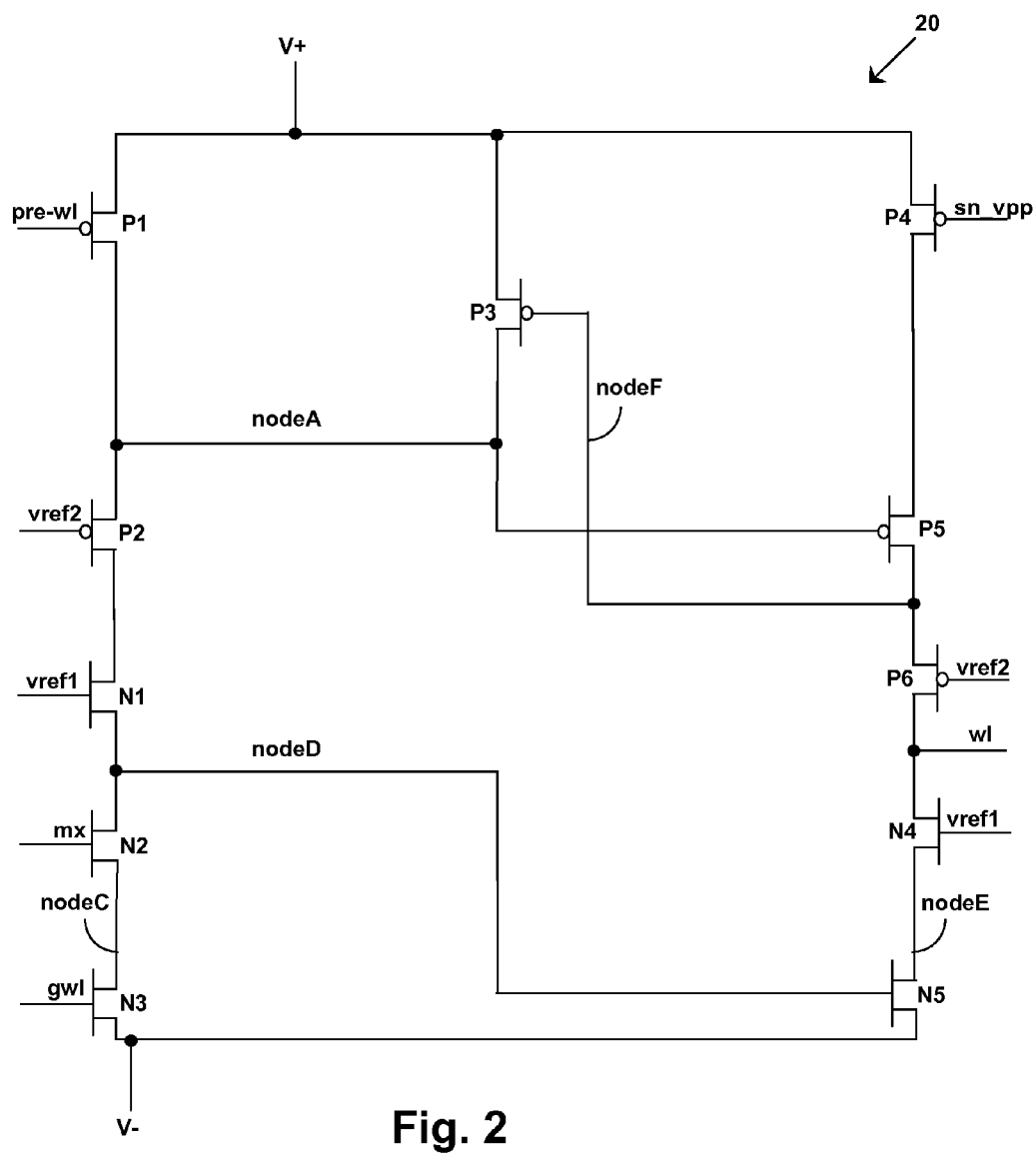
FIG. 2 is a schematic diagram of a word-line driver circuit that may be used in the memory device of FIG. 1.

Referring now to FIG. 2, an exemplary word-line driver circuit 20 that may be used to implement word-line select logic 14 of FIG. 1, is shown. Word-line driver circuit 20 receives an input word-line signal gwl and generates an output word-line signal wl that has a substantially greater voltage swing than input word-line signal gwl, without requiring level translator stages. Further, word-line driver circuit 20 can be implemented using devices having lower open-circuit breakdown voltages ($V_{DSO}$) by using a cascode arrangement. The cascode arrangement isolates devices within an input logic stack formed by transistors N1-N3 and transistors P1-P3 from bearing the entire voltage extending between positive power supply voltage V+ and negative power supply voltage V−. Similarly, another cascode arrangement isolates devices within an output logic driver stack formed by transistors N4-N5 and transistors P4-P6 from bearing the entire voltage extending between positive power supply voltage V+ and negative power supply voltage V−.

Input word-line signal gwl is provided to the gate of transistor N3, which, when activated by a higher-voltage logic state of input word-line signal gwl, causes discharge of an evaluation node nodeA that is pre-charged by activating precharge transistor P1 in response to a pre-charge control signal pre-wl. If input word-line signal gwl is in the lower-voltage logic state, evaluation node nodeA remains in the pre-charged state. Transistor N2 provides for multiplexer selection among word-line outputs of word-line selection logic 14 to reduce delay with respect to input word-line signal gwl, which is a global word-line enable. When an input control signal mx is in a higher-voltage logic state, word-line driver circuit 20 is selected, and when input control signal mx is in a lower-voltage logic state, word-line driver circuit 20 is not selected. Both word-line signal gwl and input control signal mx can have a much lower voltage swing than the difference between positive power supply voltage V+ and negative power supply voltage V−. Transistors P2 and N1 are cascode devices that prevent the full difference between positive power supply voltage V+ and negative power supply voltage V− from appearing across any of the device in the input logic stack, i.e., any of transistors N1-N3 and transistors P1-P3.

When precharge control signal pre-wl is active (lower voltage) and subsequently when evaluation node nodeA is charged prior to any evaluation, control signal mx and input word-line signal gwl are inactive (lower voltage logic state). Once evaluation node nodeA is charged, substantially all of power supply voltage V+ would be presented across the series combination of transistors N2 and N3. When control signal mx is activated, almost the entire the full power supply voltage V+ would appear across transistor N3, except for the presence of transistor N1. Transistor N1 has a gate biased at a reference voltage vref1 and so provides a source-follower that prevents the voltage at an evaluation node nodeD from rising above a voltage substantially equal to reference voltage vref1 minus the threshold voltage of transistor N2, at least while low drain-source current is present, which is just the leakage current through transistor N3 under the described conditions. Similarly, when input word-line signal gwl is in the higher-voltage logic state and word-line driver 20 is selected, transistors N2 and N3 are on. If transistor P2 were not present, substantially all of the difference between positive power supply voltage V+ and negative power supply voltage V− would be present across transistor P1 once evaluation node nodeA has been discharged. However, transistor P2 is in a cascode configuration and forms a source follower that maintains a voltage on node nodeD that does not fall below a voltage substantially equal to reference voltage vref2 plus the threshold voltage of transistor P2.

The output driver stack formed by transistors N4-N5 and transistors P4-P6 is also protected by including cascode devices. Transistor P3 is a keeper device that, when activated by a voltage on a node nodeF that is more than a threshold voltage lower than positive power supply voltage V+, provides current to maintain evaluation node nodeA in the pre-charged state. When either of transistors N2 and N3 are off, node nodeD is pulled up to a voltage substantially equal to a reference voltage vref2, which turns on transistor N5, lowering the voltage on node nodeF. Transistor P6 is a cascode device that prevents the voltage on node nodeF from substantially decreasing below reference voltage vref2, protecting the gate of transistor P3, as well as the drain-source connections of transistors P4-P5, when transistor N5 is conducting and thus output word-line signal wl is in a lower-voltage logic state. Transistor N5 is the negative driver that pulls down word-line output signal wl when evaluation node nodeA is in the pre-charged (non-evaluated) higher-voltage logic state. Transistor N4 is connected in a cascode configuration and biased by reference voltage Vref1 to prevent the voltage on a node nodeE from exceeding reference voltage Vref1 when transistor N5 is off. Transistor P4 is responsive to a control signal sn_vpp that disables the output of word-line driver circuit 20 to reduce leakage when word-line driver circuit 20 is not in use. Transistor P5 is the positive output driver that pulls up word-line output signal wl in response to evaluation node nodeA being pulled to a lower-voltage logic state when transistors N2 and N3 are turned on.

Figure 3:
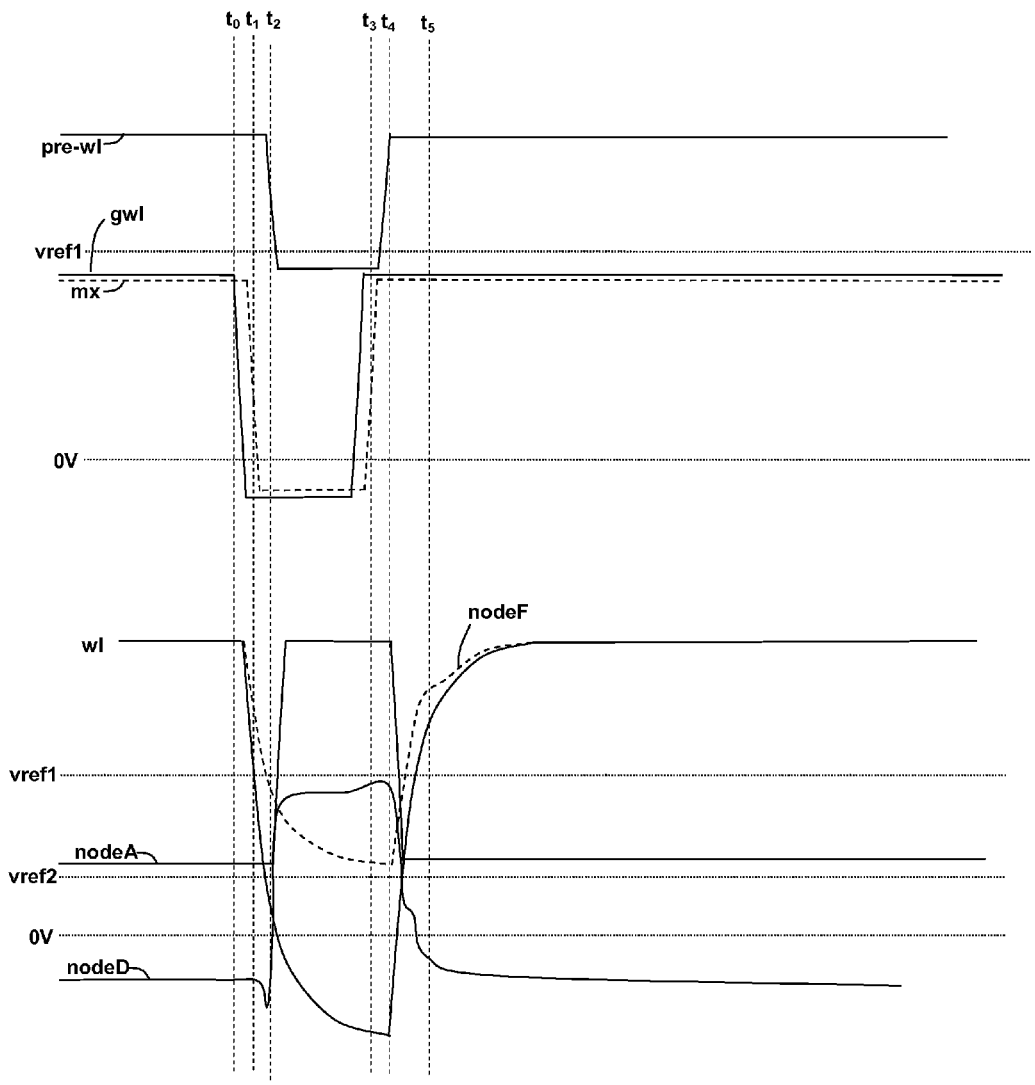
FIG. 3 is a timing diagram illustrating signals within the word-line driver circuit of FIG. 2.

Referring now to FIG. 3, the above-described operation of word-line driver circuit 20 of FIG. 2 is shown in a timing diagram. The top portion of the diagram shows the input control and data signals referenced to 0V and vref1, while the bottom portion of the diagram shows the internal nodes and output signals of word-line driver circuit 20 referenced to 0V, vref1 and vref2. At time $t_0$, word-line input signal gwl is de-asserted (low-voltage logic state) and at time $t_1$, multiplexer control signal mx is also de-asserted. A pre-charge cycle begins at time $t_2$, when pre-charge control signal pre-wl is asserted. When pre-charge control signal pre-wl is asserted, the voltage at node nodeA rises to approximately the voltage of positive power supply rail V+, and the voltage at node nodeD rises to a voltage just less than reference voltage vref1 due to the clamping action of cascode transistor N1. Transistor N5 turns on, causing word-line output signal wl to fall rapidly to near the voltage of negative power supply rail V−.

At time $t_3$, pre-charge control signal pre-wl is de-asserted. At time $t_4$, multiplexer control signal mx is asserted and word-line input signal gwl assumes the correct logic value for the cycle (in the example gwl=logical high-voltage state). Between times $t_4$ and $t_5$ evaluation node nodeA evaluates the input, which is the value of word-line input signal gwl inverted, and word-line output signal rises to a high-voltage value, which will enable the corresponding memory cells. If word-line input signal gwl were not in the logical high-voltage state, then word-line output signal wl would remain in the inactive state due to the higher-voltage pre-charged state of evaluation node nodeA which will be maintained by the voltage at node nodeF turning on keeper transistor P3. The voltage on node nodeF remains above reference voltage Vref2 due to the cascode action of transistor P6. Exemplary voltages for the word-line driver circuit 20 are V+=1.5V, V−=−0.5V, Vref1=0.75V and Vref2=0.25V. With the above voltages, evaluation node nodeA should remain between 0.25V and 1.5V and node nodeC should remain between −0.5V and 0.75V, requiring devices to withstand a maximum drain-source voltage of 1.25V, rather than almost 2V as would be implied by the power supply voltages and the output swing of word-line driver circuit 20. The leakage of the circuit is also reduced by reducing the actual drain-source voltages applied across the devices in the input and output stacks, since the leakage is determined by the lowest leakage current among the devices in the stack that are in the off state, rather than the total voltage across the stack. The input voltage swing of word-line signal gwl and input control signal mx is generally dictated by the required turn-on speed of the word-line driver circuit, and in the example may be, for example, −0.5V to +0.5V. The output swing of word-line output signal wl will be from −0.5 up to 1.5V yielding an output voltage swing of 2V from an input voltage swing of 1V, in the example, while requiring only devices that can withstand a maximum drain-source voltage of 1.25V. However, it is understood that the circuit voltages given above are only one example and that word-line driver circuits operating at other voltages and other polarities are contemplated by the Claims.

Figure 4:
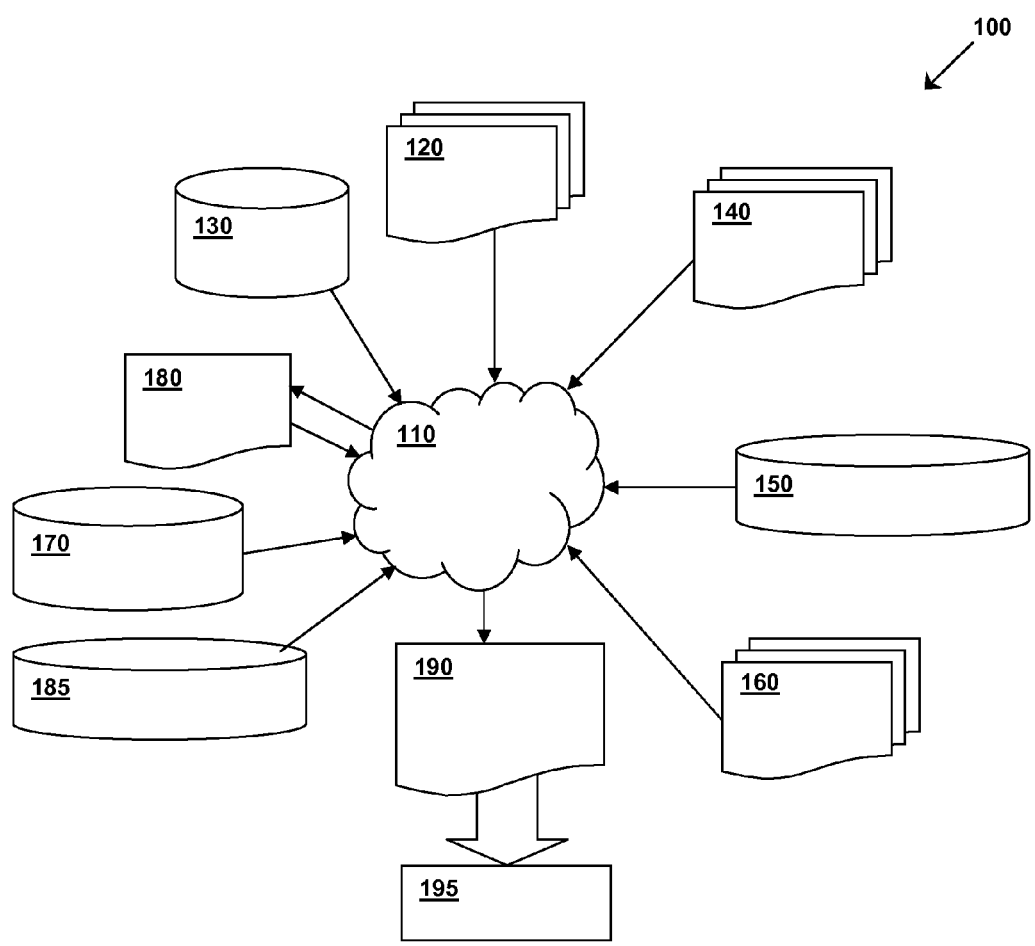
FIG. 4 is a flow diagram of a design process that can be used to fabricate, manufacture and test the memory device of FIG. 1.

FIG. 4 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-2. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA). FIG. 4 illustrates multiple such design structures including an input design structure 120 that is preferably processed by a design process 110. Input design structure 120 may be a logical simulation design structure generated and processed by design process 110 to produce a logically equivalent functional representation of a hardware device. Input design structure 120 may also or alternatively comprise data and/or program instructions that when processed by design process 110, generate a functional representation of the physical structure of a hardware device. Whether representing functional and/or structural design features, input design structure 120 may be generated using electronic computer-aided design (ECAD) such as implemented by a core developer/designer. When encoded on a machine-readable data transmission, gate array, or storage medium, input design structure 120 may be accessed and processed by one or more hardware and/or software modules within design process 110 to simulate or otherwise functionally represent an electronic component, circuit, electronic or logic module, apparatus, device, or system such as those shown in FIGS. 1-2. As such, input design structure 120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 110 preferably employs and incorporates hardware and/or software modules for synthesizing, translating, or otherwise processing a design/simulation functional equivalent of the components, circuits, devices, or logic structures shown in FIGS. 1-2 to generate a Netlist 180 which may contain design structures such as input design structure 120. Netlist 180 may comprise, for example, compiled or otherwise processed data structures representing a list of wires, discrete components, logic gates, control circuits, 110 devices, models, etc. that describes the connections to other elements and circuits in an integrated circuit design. Netlist 180 may be synthesized using an iterative process in which netlist 180 is resynthesized one or more times depending on design specifications and parameters for the device. As with other design structure types described herein, netlist 180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 110 may include hardware and software modules for processing a variety of input data structure types including Netlist 180. Such data structure types may reside, for example, within library elements 130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 140, characterization data 150, verification data 160, design rules 170, and test data files 185 which may include input test patterns, output test results, and other testing information. Design process 110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 110 without deviating from the scope and spirit of the invention. Design process 110 may also include modules for performing standard circuit design processes such as timing analysis, verification, design rule checking, place and route operations, etc. Design process 110 employs and incorporates logic and physical design tools such as HDL compilers and simulation model build tools to process input design structure 120 together with some or all of the depicted supporting data structures along with any additional mechanical design or data (if applicable), to generate a second design structure 190. Design structure 190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to input design structure 120, design structure 190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-2. In one embodiment, design structure 190 may comprise a compiled, executable HDL simulation model that functionally simulates the devices shown in FIGS. 1-2.

Design structure 190 may also employ a data format used for the exchange of layout data of integrated circuits and/or symbolic data format (e.g. information stored in a GDSII (GDS2), GL1, OASIS, map files, or any other suitable format for storing such design data structures). Design structure 190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-2. Design structure 190 may then proceed to a stage 195 where, for example, design structure 190 proceeds to tape-out, is released to manufacturing, is released to a mask house, is sent to another design house, is sent back to the customer, etc.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method of operation of a dynamic logic driver circuit, the method comprising:
receiving an input logic signal;
pre-charging an evaluation node of the dynamic driver circuit with a first one of a plurality of transistors forming an input logic stack having source and drain terminals connected in series between a power supply voltage and a power supply return voltage;
evaluating the input logic signal with the input logic stack by providing the input logic signal to a gate of a second one of the plurality of transistors and selectively discharging the evaluation node in response to a first state of the input logic signal;
first preventing failure of a given one of the first transistor or the second transistor by biasing a third one of the first plurality of transistors with a first reference voltage between the power supply voltage and the power supply return voltage, so that the third transistor forms a cascode follower that prevents a leakage current within the input logic stack from causing a full difference between the power supply voltage and the power supply return voltage from being applied across a given one of the first transistor or the second transistor; and
generating a buffered output signal from a state of the evaluation node, wherein a first voltage swing of the buffered output signal is substantially greater than a second voltage swing of the input logic signal.

2. The method of claim 1, further comprising second preventing failure of another given one of the first transistor or the second transistor by biasing a fourth one of the first plurality of transistors with a second reference voltage, so that the fourth transistor forms another cascode follower that prevents another leakage current within the input logic stack from causing the full difference between the power supply voltage and the power supply return voltage from being applied across the another given transistor.

3. The method of claim 1, wherein the generating comprises proving the evaluation node as an input to an output driver stack comprising a second plurality of transistors having source and drain terminals connected in series between the power supply voltage and the power supply return voltage, wherein a gate of a fifth one of the second plurality of transistors is connected to the evaluation node, wherein the buffered output signal is generated directly by the input logic stack and the output driver stack without using a level translation stage.

4. The method of claim 3, further comprising second preventing failure of a given one of the second plurality of transistors by biasing a sixth one of the second plurality of transistors with the at least one reference voltage, so that the sixth transistor forms a cascode follower that prevents another leakage current within the output driver stack from causing the full difference between the power supply voltage and the power supply return voltage from being applied across the given one of the second plurality of transistors.

5. The method of claim 4, wherein the generating generates the buffered output signal by controlling a gate of an eighth one of the second plurality of transistors, wherein the gate of the eighth transistor is coupled to one of the source-drain connections of the first plurality of transistors other than the evaluation node, and wherein the method further comprises third preventing failure of a given one of the fifth transistor or the eighth transistor, by biasing a gate of a seventh one of the second plurality of transistors to a fourth one of the at least one reference voltage, so that the seventh transistor forms another cascode follower that prevents another leakage current within the output driver stack from causing the full difference between the power supply voltage and the power supply return voltage from being applied across a given one of the fifth transistor or the eighth transistor.

6. The method of claim 1, further comprising second preventing failure of another given one of the first transistor or the second transistor by biasing a fourth one of the first plurality of transistors with a second reference voltage, so that the fourth transistor forms another cascode follower that prevents another leakage current within the input logic stack from causing the full difference between the power supply voltage and the power supply return voltage from being applied across the another given transistor.

7. The method of claim 1, wherein the dynamic logic driver circuit is a dynamic logic word-line driver circuit, wherein the generating generates a word-line output signal and wherein the input signal is a global word-line input signal.

\* \* \* \* \*